United States Patent [19]
Beaman et al.

[11] Patent Number: 5,811,982
[45] Date of Patent: Sep. 22, 1998

[54] HIGH DENSITY CANTILEVERED PROBE FOR ELECTRONIC DEVICES

[75] Inventors: Brian Samuel Beaman, Hyde Park; Keith Edward Fogel, Mohegan Lake; Paul Alfred Lauro, Nanuet; Maurice Heathcote Norcott, Fishkill; Da-Yaun Shih, Poughkeepsie, all of N.Y.

[73] Assignee: International Business Machines Corporation, Armonk, N.Y.

[21] Appl. No.: 614,417

[22] Filed: Mar. 12, 1996

Related U.S. Application Data

[60] Provisional application No. 60/007,577 Nov. 27, 1995.
[51] Int. Cl.$^6$ .................................................. G01R 1/073
[52] U.S. Cl. ............................................ 324/762; 324/754
[58] Field of Search .................................. 324/754, 762, 324/761, 757

[56] References Cited

U.S. PATENT DOCUMENTS

| | | |
|---|---|---|
| 3,541,222 | 11/1970 | Parks et al. . |
| 3,654,585 | 4/1972 | Wickersham ........................... 324/761 |
| 3,795,037 | 3/1974 | Luttmer . |
| 3,862,790 | 1/1975 | Davies et al. . |
| 3,954,317 | 5/1976 | Gilissen et al. . |
| 4,003,621 | 1/1977 | Lamp . |
| 4,008,300 | 2/1977 | Ponn . |
| 4,295,700 | 10/1981 | Sado . |
| 4,355,199 | 10/1982 | Luc . |
| 4,402,562 | 9/1983 | Sado . |
| 4,408,814 | 10/1983 | Takashi et al. . |
| 4,509,099 | 4/1985 | Takamatsu et al. . |
| 4,520,562 | 6/1985 | Sado et al. . |
| 4,548,451 | 10/1985 | Benarr et al. . |
| 4,555,523 | 11/1985 | Hall et al. . |
| 4,575,166 | 3/1986 | Kasdagly et al. . |
| 4,577,918 | 3/1986 | Kasdagly . |
| 4,778,950 | 10/1988 | Lee et al. . |
| 4,793,814 | 12/1988 | Zifcak et al. . |
| 4,820,170 | 4/1989 | Redmond et al. . |
| 4,820,376 | 4/1989 | Lambert et al. . |
| 4,832,609 | 5/1989 | Chung . |
| 4,833,402 | 5/1989 | Boegh-Petersen ....................... 324/754 |
| 4,991,290 | 2/1991 | MacKay . |
| 4,998,885 | 3/1991 | Beaman . |
| 5,037,312 | 8/1991 | Casciotti et al. . |
| 5,049,084 | 9/1991 | Bakke . |
| 5,099,309 | 3/1992 | Kryzaniwsky . |

OTHER PUBLICATIONS

"Shaped Elastomeric Interposer for Large Area Array Connectors", Disclosed Anonymously, Research Disclosure, Apr., 1991, No. 324, K. Mason Publications, Ltd., England.

"Elastomeric Interposer Using Wires in Elastomer Pad With Controlled Compliance" Disclosed Anonymously, Research Disclosure, Apr., 1991, No. 324, K. Mason Pub. Ltd.Eng.

"Elastomeric Interposer Using Film–Supported Metal Conductors" Disclosed Anonymously Research Disclosure, Apr., 1991, No. 324, K. Mason Publications, Ltd., England.

"High Density Area Array Connector" Disclosed Anonymously, Research Disclosure, Apr., 1991, No. 324, K. Mason Publications Ltd., England.

*Primary Examiner*—Ernest F. Karlsen
*Attorney, Agent, or Firm*—Daniel P. Morris

[57] ABSTRACT

Probes for electronic devices are described. The probe is formed by ball bonding a plurality of wires to contact locations on a fan out substrate surface. The wires are cut off leaving stubs. A patterned polymer sheet having electrical conductor patterns therein is disposed over the stubs which extend through holes in the sheet. The ends of the wires are flattened to remit the polymer sheet in place. The wire is connected to an electrical conductor on the polymer sheet which is converted to a contact pad on the polymer sheet. A second wire is ball bonded to the pad on the polymer sheet and cut to leave a second stub. The polymer sheet is laser cut so that each second stub is free to move independently of the other second studs. The ends of the second stubs are disposed against contact locations of an electronic device, such as an FC chip, to test the electronic device.

13 Claims, 9 Drawing Sheets

HIGH DENSITY CANTILEVERED PROBE FOR ELECTRONIC DEVICES

This application claims priority from Provisional Application Ser. No. 60/007,577 which was filed on Nov. 27, 1995.

FIELD OF THE INVENTION

The present invention is directed to probe structures for testing of electrical interconnections to integrated circuit devices and other electronic components and particularly to testing integrated circuit devices with flat or recessed surfaces for wired bonded interconnections.

BACKGROUND OF THE INVENTION

Integrated circuit (IC) devices and other electronic components are normally tested to verify the electrical function of the device and certain devices require high temperature burn-in testing to accelerate early life failures of these devices. The various types of interconnection methods used to test these devices include permanent, semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques are typically used for testing integrated circuit devices with solder ball attachment to a ceramic or plastic pin grid array package. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to a probe socket that is hard wired to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This type of probe is also much larger that the IC device that is being tested and is limited to testing a single IC device at a time.

Another technique used for testing IC devices uses a thin flex circuit with metal bumps and fan out wiring. The bumps are typically formed using photolithographic processes and provide a raised contact for the probe assembly. The bumps are used to contact the flat or recessed wire bond pads on the IC device. An elastomer pad is typically used between the back of the flex circuit and a pressure plate or rigid circuit board to provide compliance for the probe interface. This type of probe is limited to flexible film substrate materials that typically have one or two wiring layers. Also, this type of probe does not provide a wiping contact interface to ensure a low resistance contact. The prior art described below includes a variety of different probe fixtures for testing bare IC chips.

Prior Art

1. U.S. Pat. No. 5,172,050, issued Dec. 15, 1992 to Swapp is directed to fixtures for testing bare IC chips. The fixture is manufactured from a silicon wafer or other semiconductor substrate material. The probe contacts are fabricated in the top surface of the substrate using micromachining techniques. Each probe contact is formed by etching a cavity into the substrate with a cantilevered beam extending into the center of the cavity. The minimum spacing and density of the probe contacts is limited by the need to use the space between the contacts for fan out wiring and the diameter of the cavities must be larger than the contact pad on the IC device to allow the cantilever beam contacts to flex. Although this technique is similar to the probe structure described in this patent application, it is limited to substrates made from a silicon wafer or other semiconductor materials.

2. U.S. Pat. No. 5,177,439, issued Jan. 5, 1993 to Liu et al., is directed to fixtures for testing bare IC chips. The fixture is manufactured from a silicon wafer or other substrate that is compatible with semiconductor processing. The substrate is chemically etched to produce a plurality of protrusions to match the I/O pattern on the bare IC chip. The protrusions are coated with a conductive material and connected to discrete conductive fan out wiring paths to allow connection to an external test system. The probes described in this patent are rigid and do not provide a wiping interface with the mating contacts on the IC device. Also, the substrate used for fabrication of this probe fixture is limited to semiconductor wafers which are relatively expensive. The high density cantilever test probe can be fabricated on a variety of inexpensive substrate with the fan out wiring.

3. U.S. application Ser. No. 08/754,869 filed on Nov. 22, 1996, pending, describes a high density test probe for integrated circuit devices. The probe structure described in this docket uses short metal wires that are bonded on one end to the fan out wiring on a rigid substrate. The wires are encased in a compliant polymer material to allow the probes to compress under pressure against the integrated circuit device. The wire probes must be sufficiently long and formed at an angle to prevent permanent deformation during compression against the integrated circuit device. High temperature applications of this type of probe are limited due to the glass transition temperature of the polymer material surrounding the probes as well as the coefficient of thermal expansion mismatch between the compliant polymer material and the rigid substrate.

SUMMARY OF THE INVENTION

It is the object of the present invention to provide a probe for testing integrated circuit devices and other electronic components that use flat or recessed surfaces for wire bonded interconnectors.

Another object of the present invention is to provide a probe structure that is an integral part of the fan out wiring on the test substrate or other printed wiring means to minimize the electrical conductor length as well as the contact resistance of the probe interface.

A further object of the present invention is to provide a raised probe tip for contacting recessed surfaces on the IC device.

An additional object of the present invention is to provide a compliant probe structure that has a wiping interface as the probe is compressed against the mating contacts on the IC device.

Yet another object of the present invention is to provide a fabrication process that minimizes the potential for damaging the interconnect circuit wiring in the substrate material.

Yet an additional object of the present invention is to provide a high density probe structure to allow multiple chips to be tested by a single test fixture.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Preferred Embodiment

Figure 1:
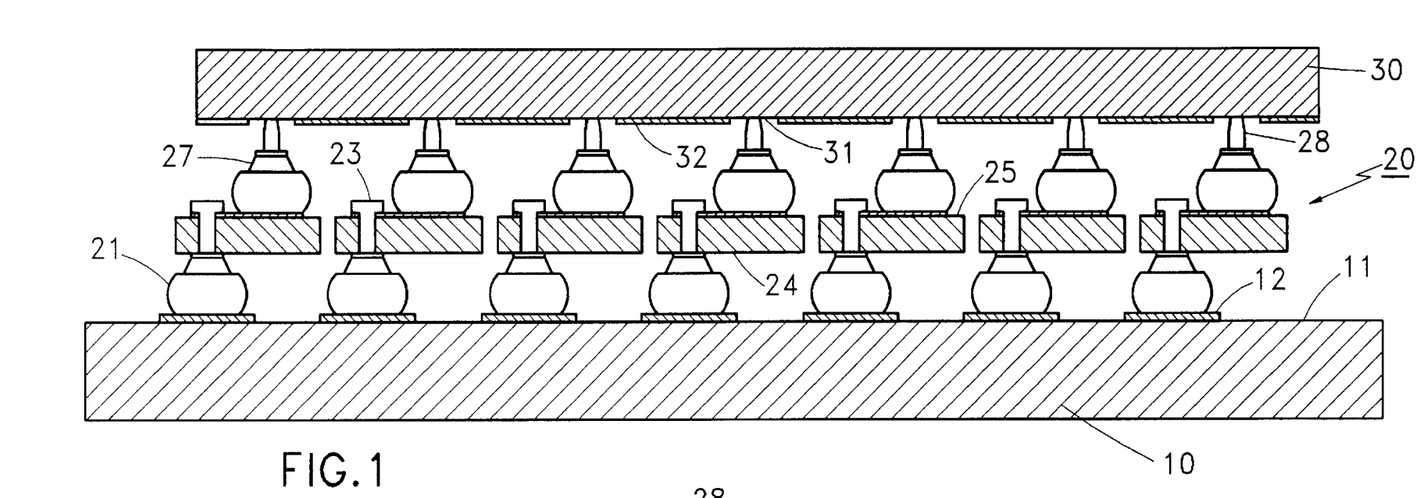
FIG. 1 shows a cross section of a high density cantilever test probe attached to a substrate and pressed against the bond pads on an integrated circuit device.

FIG. 1 shows a cross section of a test substrate (10) and high density cantilever test probe (20) according to the present invention. The test substrate (10) provides a rigid base for attachment of the probe structures (20) and fan out wiring from the high density array of probe contacts to a larger grid of pins or other interconnection means to the equipment used to electrically test the integrated circuit device. The fan out substrate can be made from various materials and constructions including single and multi-layer ceramic with thick or thin wiring, silicon wafer with thin film wiring, or epoxy glass laminate construction with high density copper wiring. The cantilever test probes (20) are attached to the first surface (11) of the substrate (10). The probes are used to contact the bond pads (31) on the integrated circuit device (30). The surface of the bond pads (31) are recessed slightly below the surface of the passivation layer (32) on the integrated circuit device (30).

The cantilever probe structure (20) is comprised of a first ball bond (21) attached to the fan out wiring (12) of the test substrate (10). A flexible polymer beam (24) is connected to the top of the first ball bond (21) by a flattened stud (23). A second ball bond (27) with a short stud (28) is attached to the flexible polymer beam (24). The geometry and elastic properties of the flexible polymer beam (24) are optimized to allow movement of the short stud (28) on the second ball bond (27).

Figure 2:
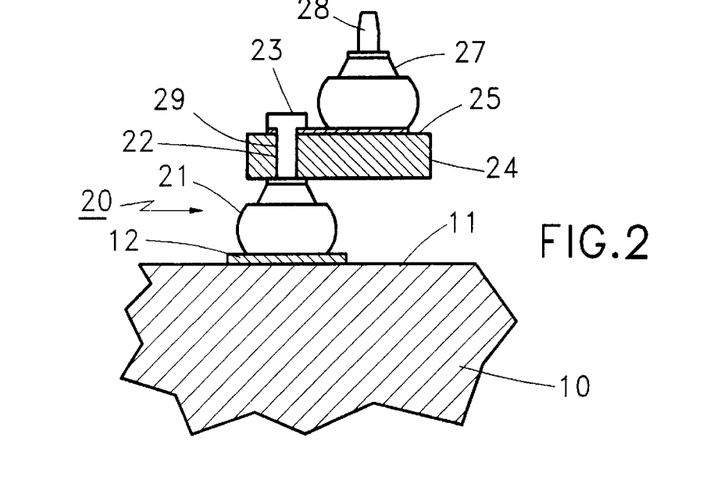
FIG. 2 shows an enlarged cross section of a single high density cantilever test probe attached to the fan out wiring on the test substrate.

FIG. 2 shows an enlarged cross section of the high density cantilever test probe (20). The first ball bond (21) is attached to the fan out wiring (12) on the first surface (11) of the substrate (10) to minimize the resistance of the probe interface. A first short stud (22) protrudes from the first ball bond (21) through a hole (29) in the flexible polymer beam (24). The top of the first short stud (23) is flattened to lock the flexible polymer beam (24) in place. The second ball bond (27) is attached to the metallized layer (26) on the first surface (25) of the flexible polymer beam (24). A second short stud (28) protrudes from the second ball bond (27) to provide the contact interface for the probe.

Figure 3:
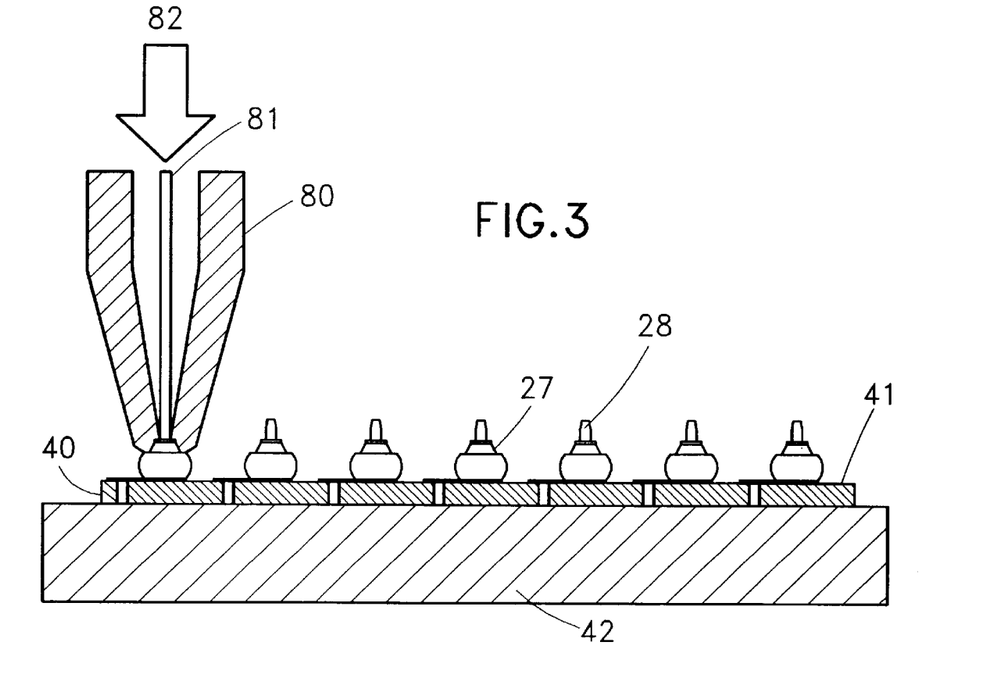
FIGS. 3–6 show the processes used to fabricate the high density cantilever test probe structure on a fan out wiring substrate.

FIG. 3 shows the first process used of fabricate the high density cantilever probe. A thermosonic wire bonder tool is used to attach ball bonds (27) to the first surface (41) of a sheet of flexible polymer material (40). The wire bonder tool uses a ceramic capillary (80) to press the ball shaped end of the bond wire (81) against the first surface (41) of the polymer sheet (40). Compression force and ultrasonic energy (82) are applied through the capillary (80) tip and thermal energy is applied from the wire bonder stage through the rigid work holder (42) to bond the ball shaped end of the bond wire (81) to the first surface (41) of the polymer sheet (40). The rigid work holder (42) is temporarily attached to the polymer sheet to increase the rigidity of the thin sheet. The bond wire (81) is cut, sheared, or broken to leave a small stud (28) protruding vertically from the ball bond (27).

Figure 4:
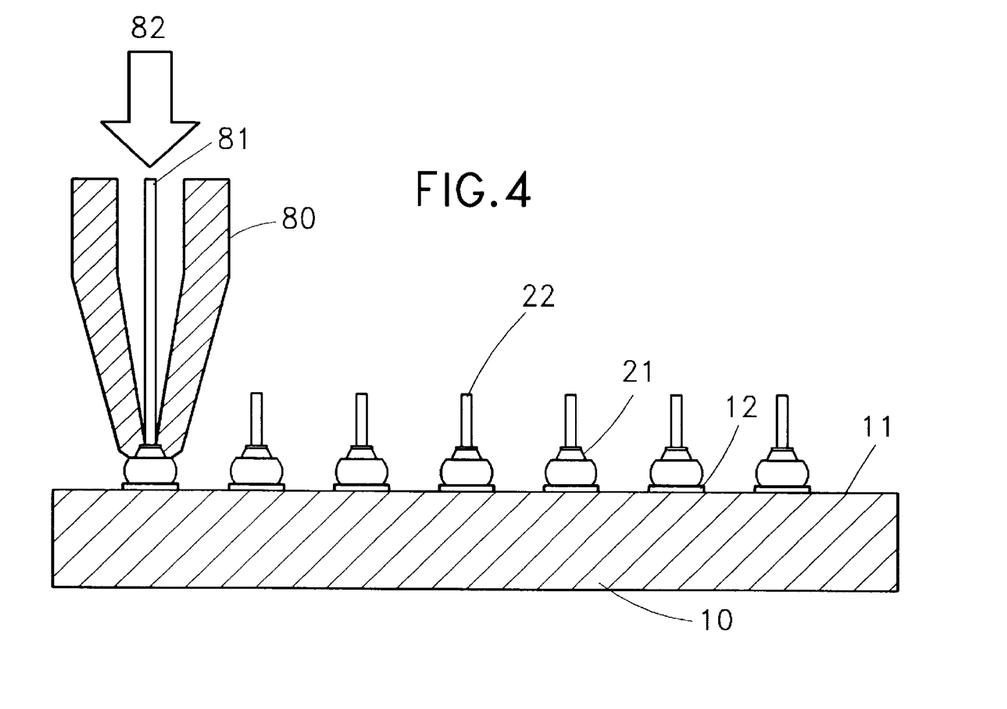
Figure 5:
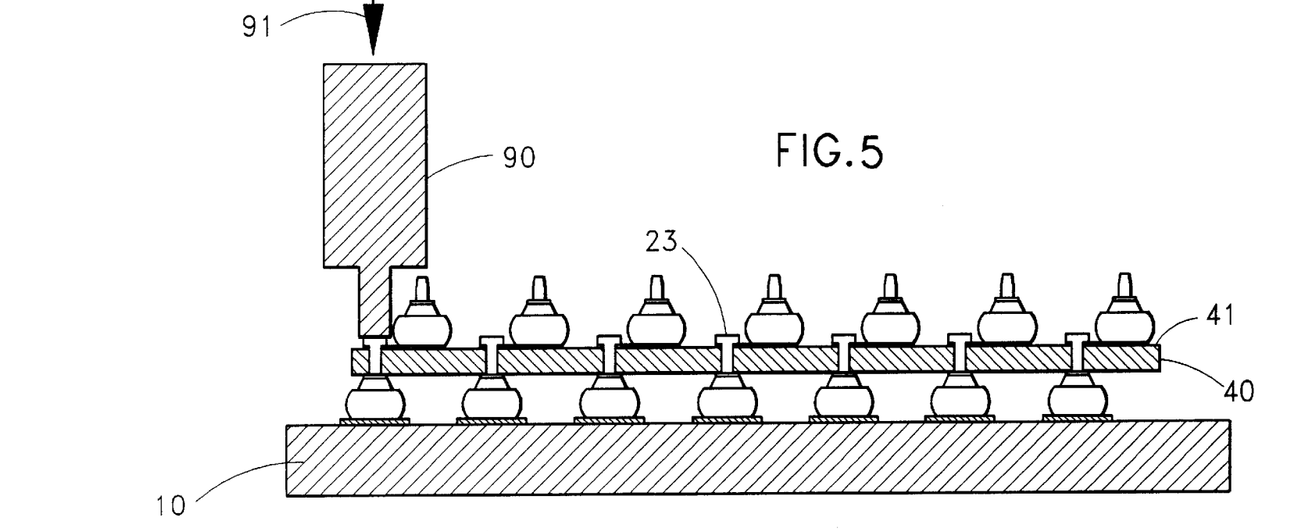
Figure 6:
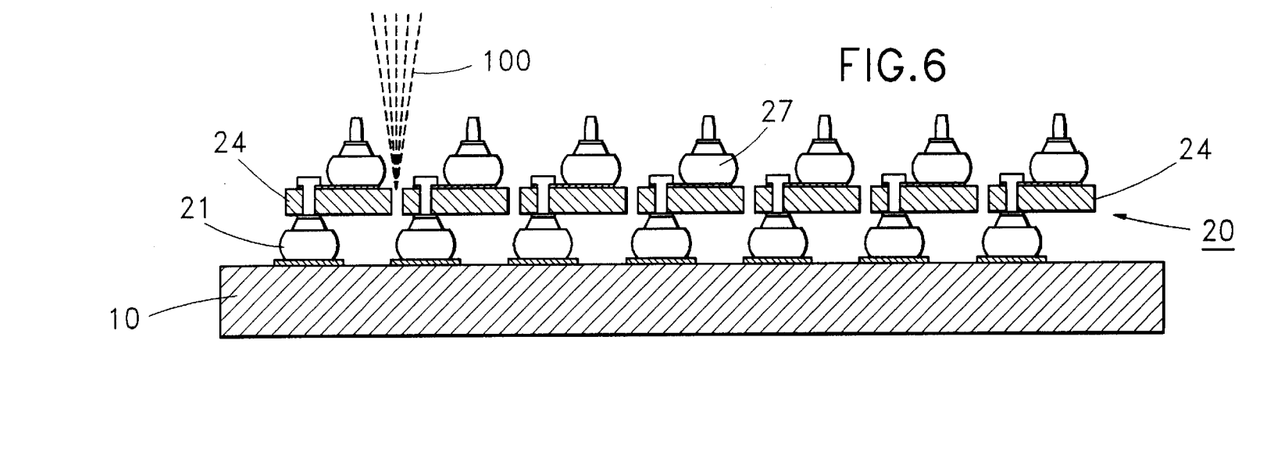

FIG. 4 shows the wire bonder tool used to attach bond bonds (21) to the first surface (11) of a rigid substrate (10). The ball bonds (21) are attached to the fan out wiring (12) on the first surface (11) of the rigid substrate (10). The bond wire (81) is cut, sheared, or broken to leave a small stud (22) protruding vertically from the ball bond (21). A plurality of holes in the sheet of flexible polymer material (40) are aligned with the corresponding short studs (22) protruding from the ball bonds (21) attached the rigid substrate (10) as shown in FIG. 5. The ends of the short studs (22) are flattened by compressive force (91) applied to a hardened anvil tool (90) to lock the sheet of polymer sheet (40) in place. FIG. 6 shows a laser (100) used to separate the polymer sheet (40 into in individual flexible polymer beams (24). The individual polymer beams (24) allow the cantilever probes (20) to move independent from the adjacent probes.

Figure 7:
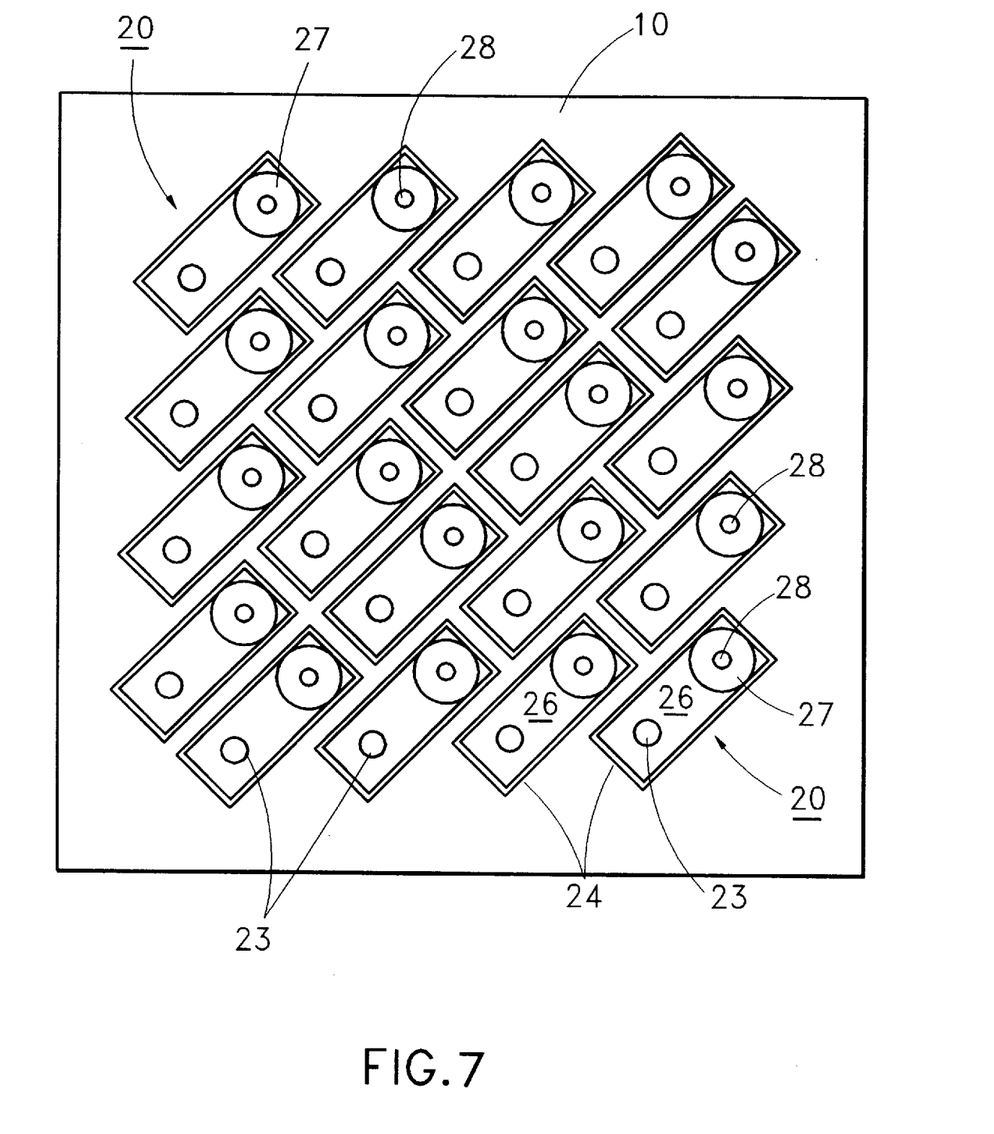
FIG. 7 shows a top view of an area array of high density cantilever test probes.

FIG. 7 shows a top view of an array configuration of the high density cantilever test probes. Each of the cantilever test probes is completely separated from the adjacent probes. The test probes can be arranged in other configurations as well including peripheral and partial or random array configurations to match the contacts on the device to be tested.

Figure 8:
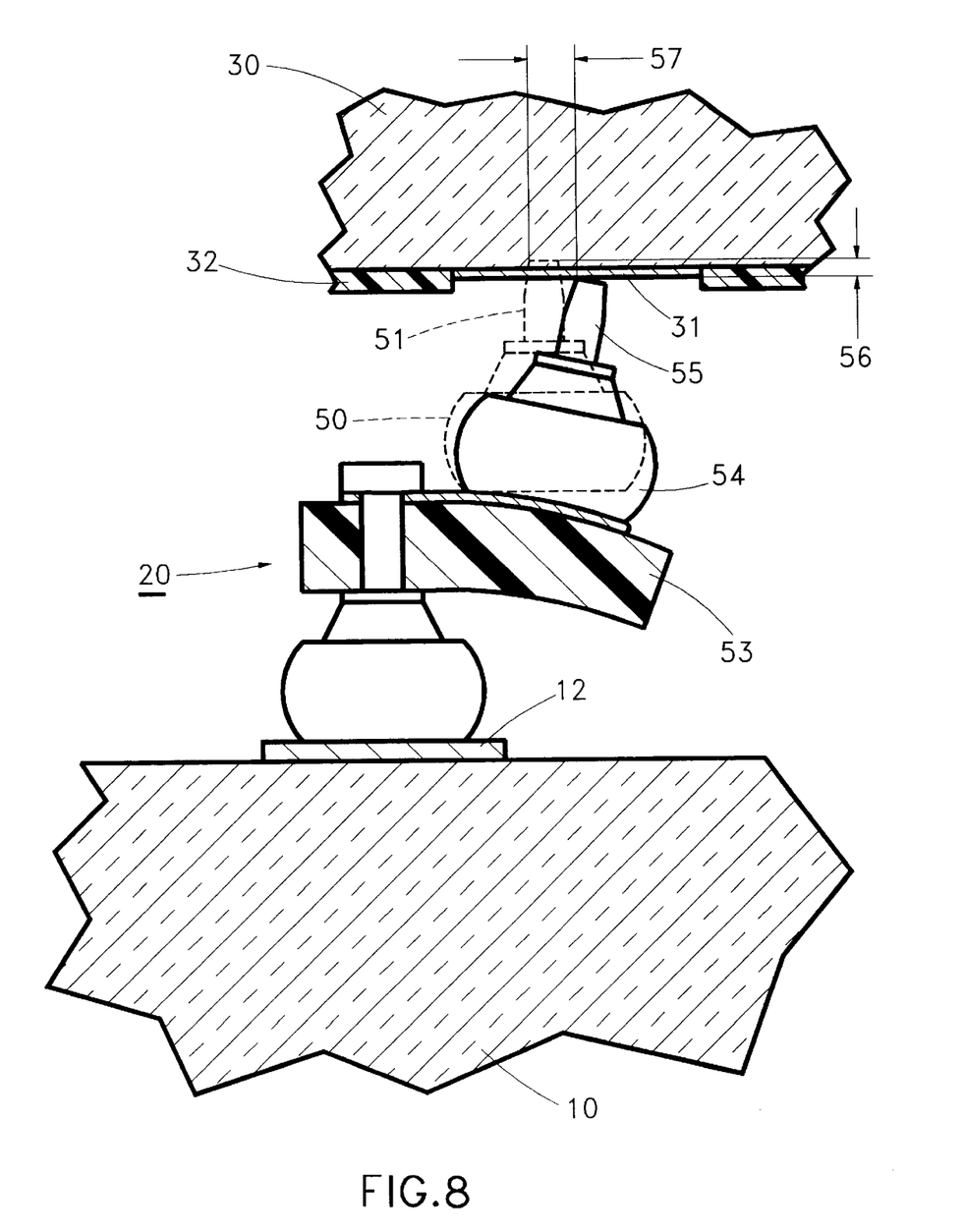
FIG. 8 shows the wiping action of the high density cantilever test probe structure while it is pressed against the bond pads on an integrated circuit device.

FIG. 8 shows a magnified cross section of the high density cantilever probe (20) pressed against the bond pads (31) on an IC device (30). FIG. 7 also shows an outline of the second ball bond (50) and second short stud (51) in the uncompressed position. As the cantilever probe (20) is pressed against the IC device (30), the flexible polymer beam (53)

bends and causes the tip of the second short stud (55) protruding from the second ball bond to wipe (57) against the bond pad (31). The wiping action (57) of the cantilever probe (20) ensures a good electrical connection to the IC device (30) by cutting through any oxide or films that may be on the surface of the bond pad (31). The distance that the cantilever probe (20) wipes is controlled by the geometry of the flexible polymer beam and the amount of compression (56) of the probe.

Alternate Embodiments

Figure 9:
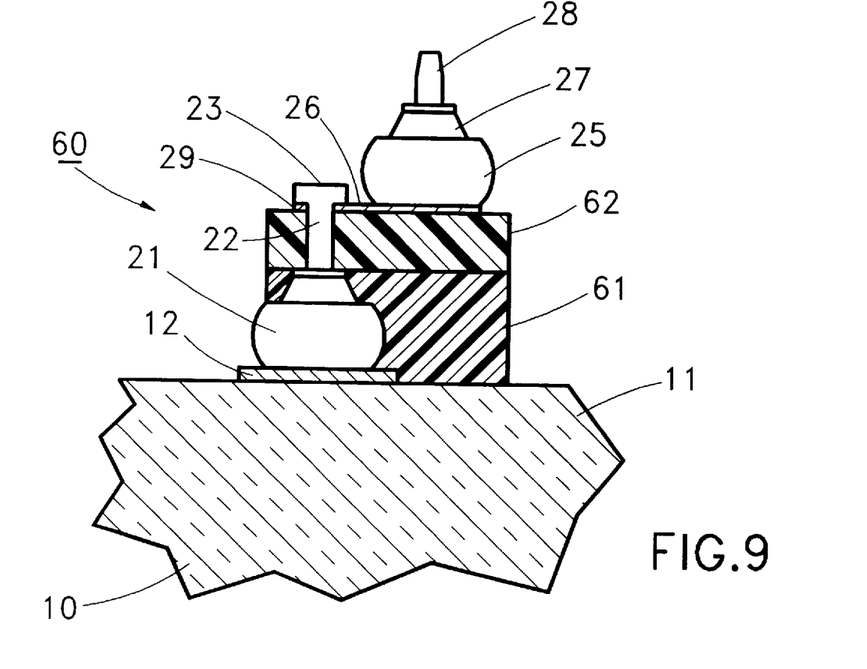
FIGS. 9, 10 and 11 show alternate embodiments of the high density cantilever test probe structure.

FIG. 9 shows a magnified cross section of an alternate embodiment of the high density cantilever test probe (60). The alternate embodiment uses a layer of elastomer (61) between the first surface of the substrate (11) and the flexible polymer beam (62). In this embodiment, the thickness of the polymer beam (62) can be reduced since the elastic properties of the cantilever probe (60) are primarily determined by the elastomer layer (61). The elastomer layer (61) is added to the cantilever probe structure (60) after the first ball bonds (21) and short studs (22) are attached to the substrate (10) and before the flexible sheet of polymer (40) is placed over the ends of the first short studs (22). The laser process (100) that is used to separate the polymer sheet (40) into individual polymer beams (62) is also used to separate the layer of elastomer (61) into individual segments.

Figure 10:
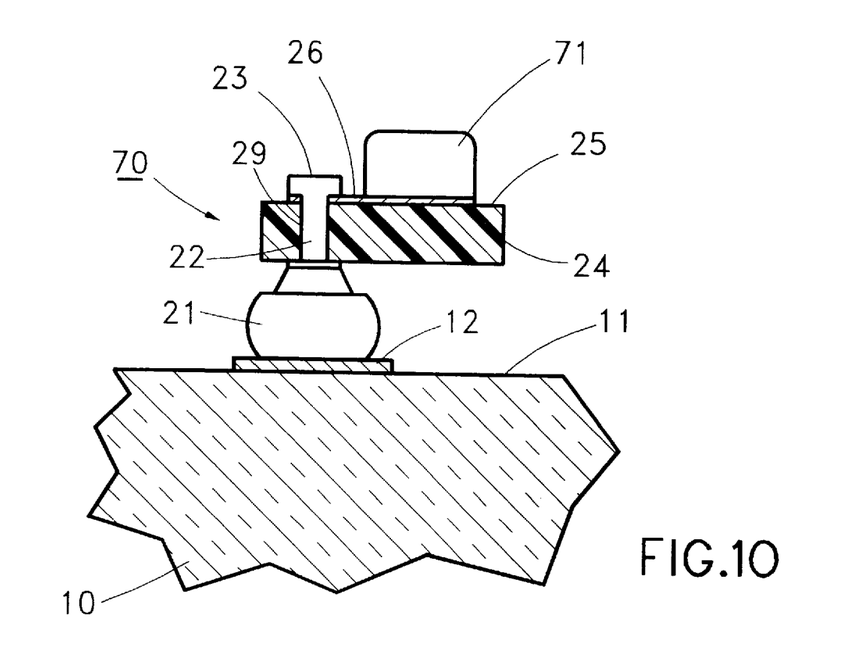

FIG. 10 shows a magnified cross section of an additional alternate embodiment of the high density cantilever test probe (70). This embodiment of the cantilever probe uses a plated bump (71) on the end of the flexible polymer beam (24) instead of the second wire bond (27) and short stud (28). The plated bumps (71) are fabricated using conventional photolithographic processes and should be less expensive than the wire bonded probe contacts (27+28).

Figure 11:
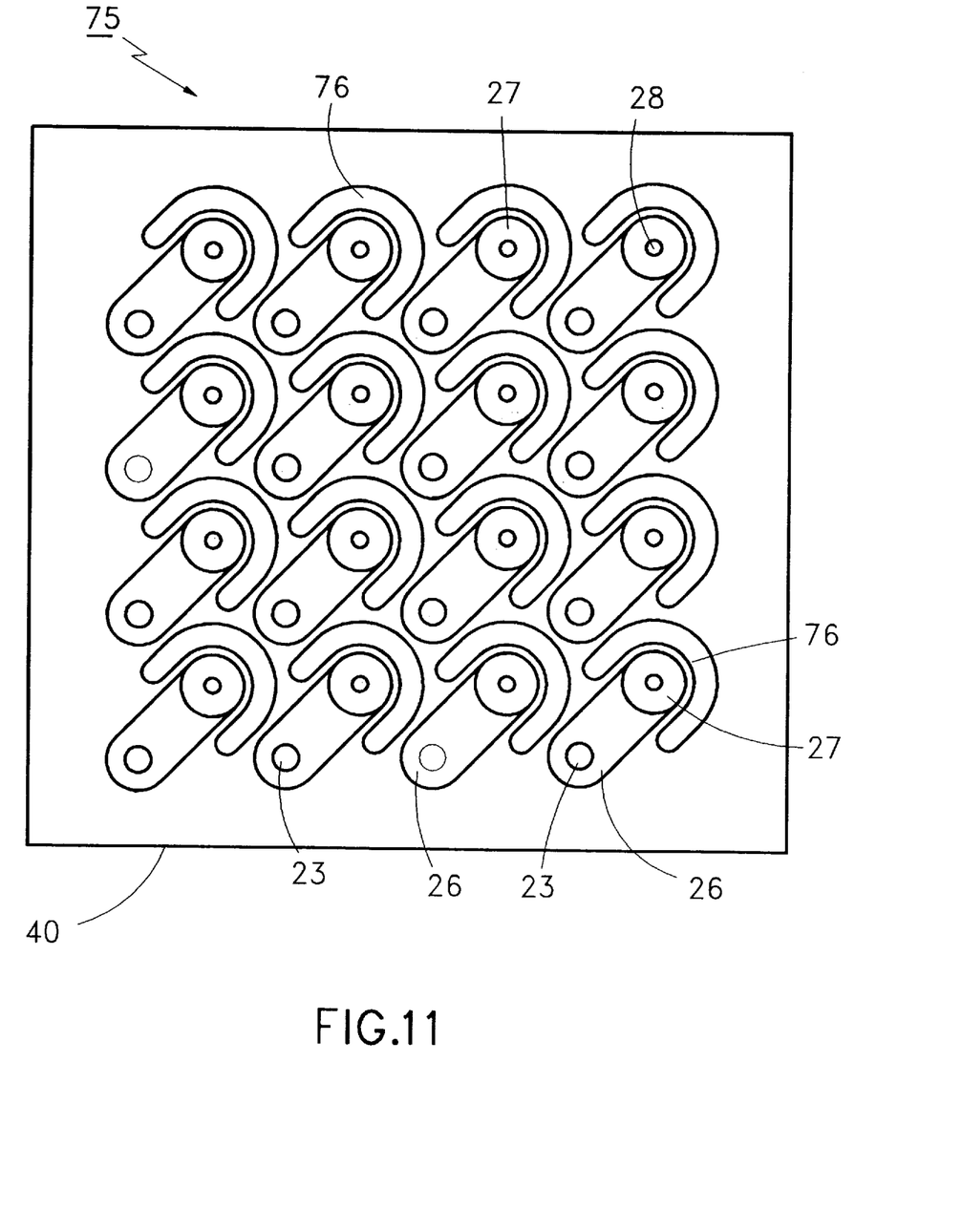
Figure 12:
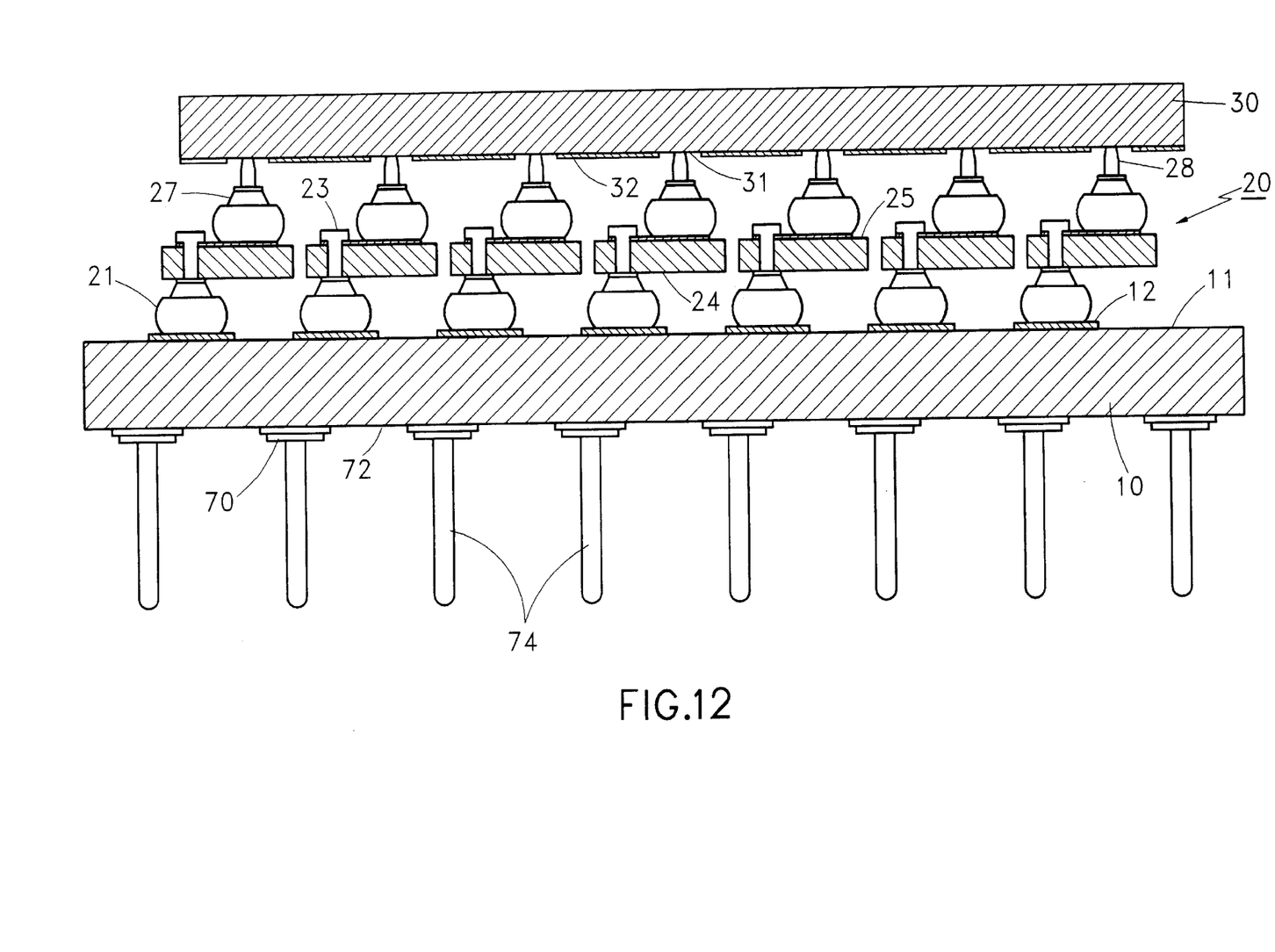
FIG. 12 shows the structure of FIG. 1 with pins 74 mounted to surface 72.
Figure 13:
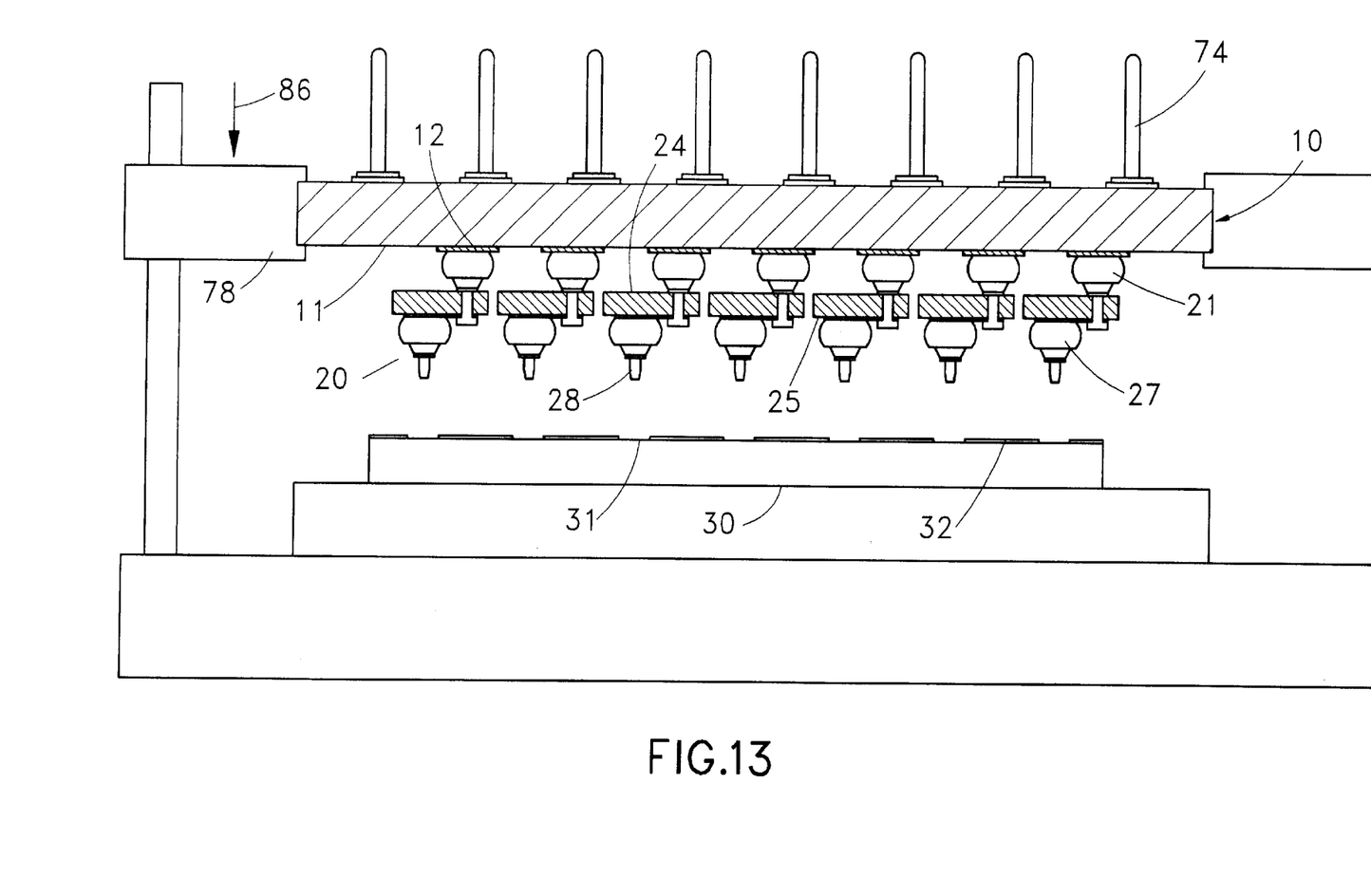
FIG. 13 shows the structure of FIG. 12 mounted in an apparatus to probe pads 32 on surface 31 of device 30.

FIG. 11 shows a top view of another alternate embodiment of the high density cantilever test probe (75). The cantilever test probes in this embodiment are only partially separated from the adjacent probe structures. A single slot (76) or series of holes and slots are created in the sheet of flexible polymer material to allow the probe tip (28) and second ball bond (27) to move independently of the adjacent probe tips. The geometry of the slot (76) can be modified to optimize the elastic behavior and compliance of the probe structure.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A structure for probing electronic devices contact locations comprising:

a substrate having a first electrical contact location thereon;

a first electrical conductor having a first end in electrical contact with said first contact location and a second end extending away therefrom;

said second end terminating at a surface of a material having a second electrical contact thereon;

a second electrical conductor having a third end in electrical contact with said second electrical contact and a fourth end extending away from said second electrical contact location, said fourth end is adapted for probing said electronic device contact locations;

said material is a layer of flexible material which cantilevers from said second end; said layer has a bottom surface which is disposed facing and spaced apart from said substrate.

2. A structure according to claim 1, wherein said material is compressible.

3. A structure according to claim 2, wherein said material extends from said second end to said first contact location.

4. A structure according to claim 1, wherein said second end extends through an opening in said material and is flattened to affix said first conductor to said material.

5. A structure according to claim 1, wherein said first electrical conductor is a wire which is bonded at said first end to said first electrical contact location.

6. A structure according to claim 1, wherein said second conductor is a wire which is ball bonded at said third end to said second contact location.

7. A structure according to claim 1, wherein said second conductor is a plated protuberance on said second electrical conductor.

8. A structure according to claim 6, wherein said first conductor is a wire ball bonded to said first electrical conductor at said first end and wherein said second end is flattened riveting said second end to said material.

9. A structure according to claim 8, wherein said first conductor is a wire ball bonded to said first electrical conductor at said first end and wherein said second end is flattened riveting said second end to said material.

10. A structure according to claim 1, further including a means for moving said fourth end into engagement with said electronic device contact locations.

11. A structure according to claim 10, further including means to electrically test an electronic device through said electronic device contact locations.

12. A structure according to claim 11, wherein said substrate has a surface containing a plurality of pins for providing electrical signals to said fourth ends.

13. A structure according to claim 1, wherein said first electrical contact locations are on a first side of said substrate, said substrate has third electrical contact locations on a second side, said third electrical contact locations are in electrical communication with the said first electrical contact locations; said third electrical contact locations provide means for applying electrical signals to said electronic contact locations.

* * * * *